United States Patent [19]

Gustin

[11] Patent Number: 5,056,056
[45] Date of Patent: Oct. 8, 1991

[54] DATA RECORDER INCLUDING A RECIRCULATING NON-VOLATILE MEMORY

[75] Inventor: Thomas W. Gustin, Xenia, Ohio

[73] Assignee: Systems Research Laboratories, Inc., Dayton, Ohio

[21] Appl. No.: 305,038

[22] Filed: Feb. 2, 1989

[51] Int. Cl.⁵ .............................................. G11C 11/00
[52] U.S. Cl. ...................................... 364/900; 360/5; 360/22; 369/20
[58] Field of Search .................... 365/104; 360/89, 88, 360/5, 22; 369/20

[56] References Cited

U.S. PATENT DOCUMENTS 4,409,670 10/1983 Herndon et al. .................... 364/900
4,646,241 2/1987 Ratchford et al. ................. 364/424

*Primary Examiner*—Terrell W. Fears

[57] ABSTRACT

A light weight data recorder employs a non-volatile electronic memory to store several channels of data occurring before and after a triggering event. Data may be retained in the memory with the aid of a NiCad battery. Upon the occurrence of a triggering event, which may be user defined, the input of new data into the memory will be terminated after a selectable predetermined time has passed. This allows data to be recorded both before and after a specified event. The triggering event may be derived by sensing a change in the signal level of one of the data inputs by a predetermined amount, or it may be a specially generated signal. Once a triggering event has occurred, the data retained in memory is protected. Circuit means are provided to retrieve the stored data without destroying it. Another circuit permits recording of new data in the memory only after a unique signal has been detected.

7 Claims, 5 Drawing Sheets

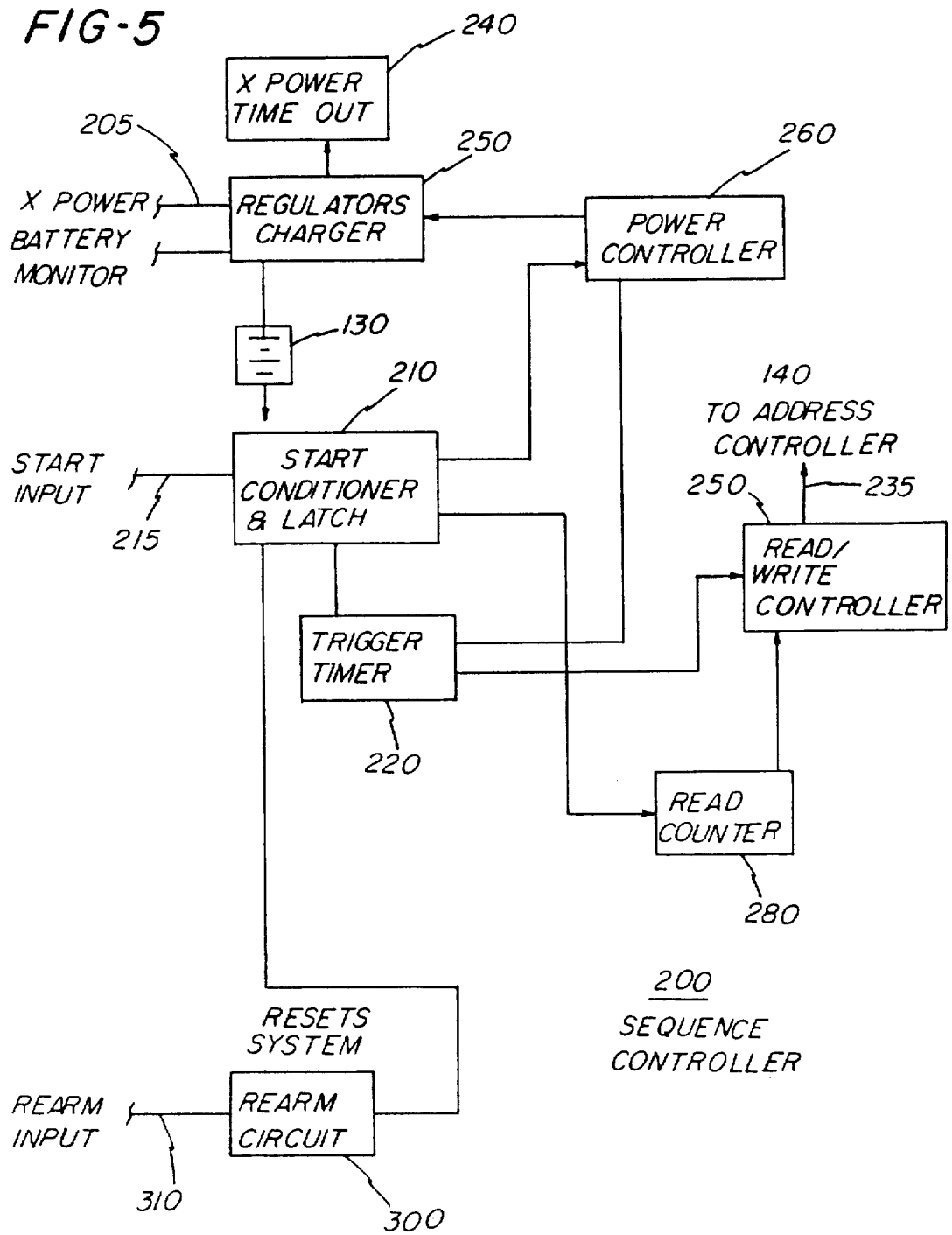

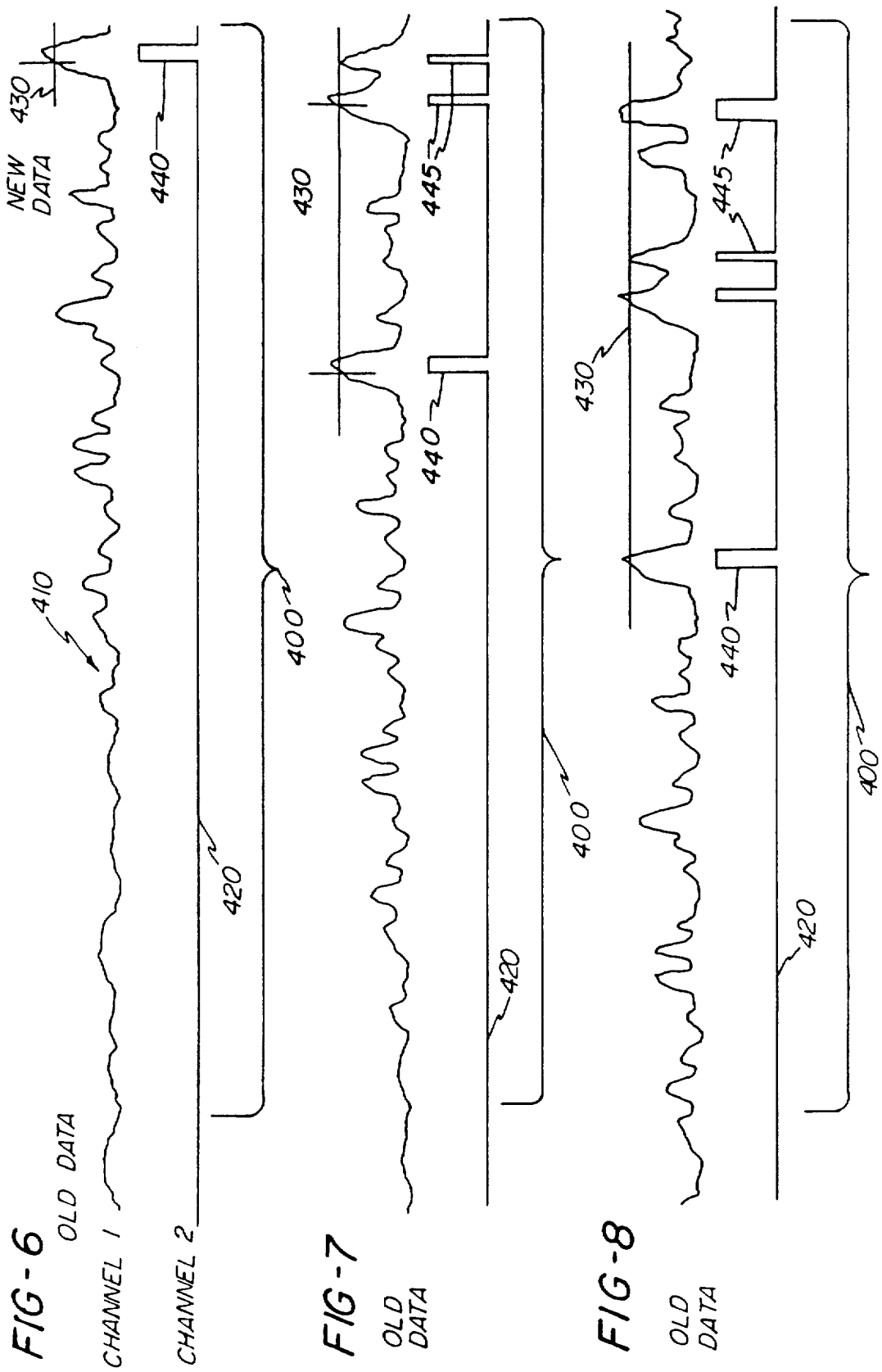

DATA RECORDER INCLUDING A RECIRCULATING NON-VOLATILE MEMORY

BACKGROUND OF THE INVENTION

This invention relates to a small, compact data recorder capable of retaining data from a plurality of sensors.

Portable recorders for retaining data from various sensors have been used for many years. One well known recorder is the so-called 'black box' recorder carried by commercial and other aircraft. These devices record certain critical data and may be of use in setting maintenance schedules, or in the event of a crash, to assist in determining the cause thereof. Some data recorders use magnetic tape while others use solid-state storage devices. This type of portable recorder, however, is usually too large and heavy to be used to collect data from small vehicles, anatomical dummies and the like.

Gathering the data that is generated by various sensors on smaller vehicles or objects has been done in the past by using either an umbilical cable or radio telemetry. Clearly, an umbilical cable imposes severe restrictions on mobility, and radio telemetry is subject to loss of data due to radio interference, misalignment of antennas or extremes in the test environment.

SUMMARY OF THE INVENTION

This invention relates to an unique data recording device, and especially a portable device for recording data in a non-volatile electronic memory. This invention is particularly useful for recording data representing events occurring immediately before, during, and immediately after a specified action. The recorder is of such small size that it may be carried by the object undergoing testing, and yet is rugged enough to withstand the testing environment.

For example, this invention would be useful in the testing and monitoring of aircraft ejection seat performance. Military ejection seats contain ejection seat sequencing circuitry that is designed to alter timing and power requirements dynamically, based on static and dynamic pressures and on acceleration information provided by various sensors associated with the seat. Present day techniques for monitoring the performance of these seats has not been satisfactory for the reasons described above.

The data developed by sensors attached to manikins used in ejection seat tests, as well as in automobile and motorcycle tests, may be retained by the data recorder of the present invention without the data recorder itself adversely affecting or influencing the test. This would not be possible with heavy and bulky prior art recorders, nor would it be possible where umbilical cables were used.

The data recorder of the present invention has, of necessity, a fixed amount of memory. Information from the sensors in analog form is converted into digital format and stored in the memory, with new data overwriting the old data. A predetermined time after the occurrence of a triggering event, which may be user defined, the entry of new data into the memory will be terminated. For example, the triggering event might be the actual ejection of an aircraft seat, or the crash of a vehicle in or on which a manikin is riding. Therefore, in the recorder of the present invention, data will be stored for a predetermined time before and after such triggering event.

The data is retained in an electronic memory which is made non-volatile by an internal battery. Normally, while the data recorder is attached to the system undergoing testing, current would be drawn from that system, however, after a triggering event, the data recorder, and other parts of the system, are frequently separated from the system power supply, and for this reason, an internal battery supply is provided.

The data recorder of this invention is also provided with means for protecting the recorded data once a triggering event has occurred. The data may be accessed and read but not overwritten unless special procedures are invoked.

Accordingly, it is an object of this invention to provide a small sized data recorder for use in storing in a non-volatile memory a limited quantity of data occurring before and after a triggering event.

It is a further object of this invention to provide a small sized data recorder for use in storing in a non-volatile memory a limited quantity of data occurring before and after a triggering event, said recorder comprising a digital memory means for storing a fixed amount of data; means for retaining the data stored in said memory means; control circuit means for controlling the flow of data into said memory means; means responsive to the occurrence of the triggering event for providing a signal to said control circuit means to terminate the input of new data into said memory means a predetermined time thereafter.

Other objects and advantages of the invention will be apparent from the following description, the accompanying drawings and the appended claims.

BRIEF DESCRIPTION OF THE DRAWINGS

FIG. 5 is an electrical block diagram of the power sequence controller board.

FIG. 6-8 is a set of waveforms illustrating one mode of operation of this invention.

DESCRIPTION OF THE PREFERRED EMBODIMENT

Figure 1:
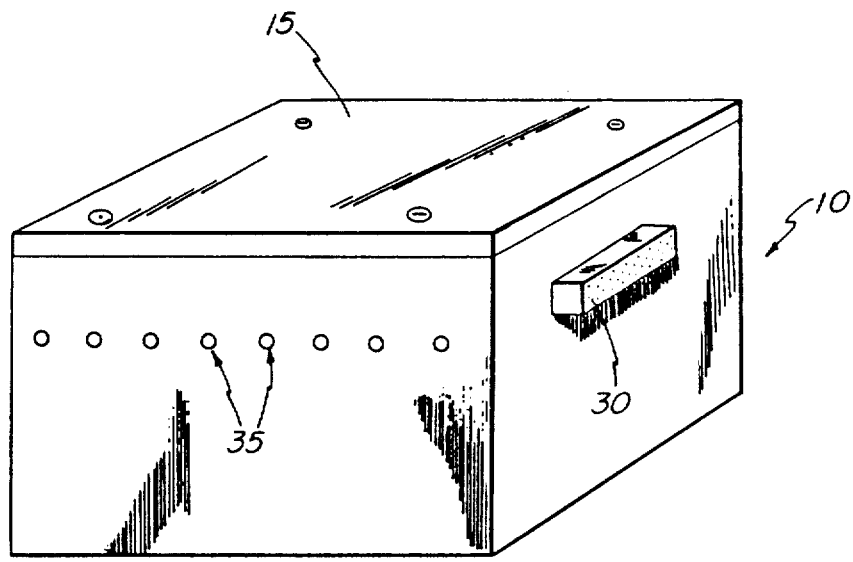
FIG. 1 is a front perspective view of one embodiment of a data recorder constructed according to this invention.

Referring now to the drawings, and particularly to FIG. 1, a data recorder 10 includes a case 15 for housing the components comprising this invention. Data is introduced into the recorder through a multi-pin connector 30 placed on one side of the case, while processed and recorded data is available on that same multi-pin connector 30. The input data, usually in analog form, may be modified by gain adjustment potentiometers 40 and offset adjustment potentiometers 42 that are accessible through a plurality of openings 35 in the sides of the case 10.

Figure 2:
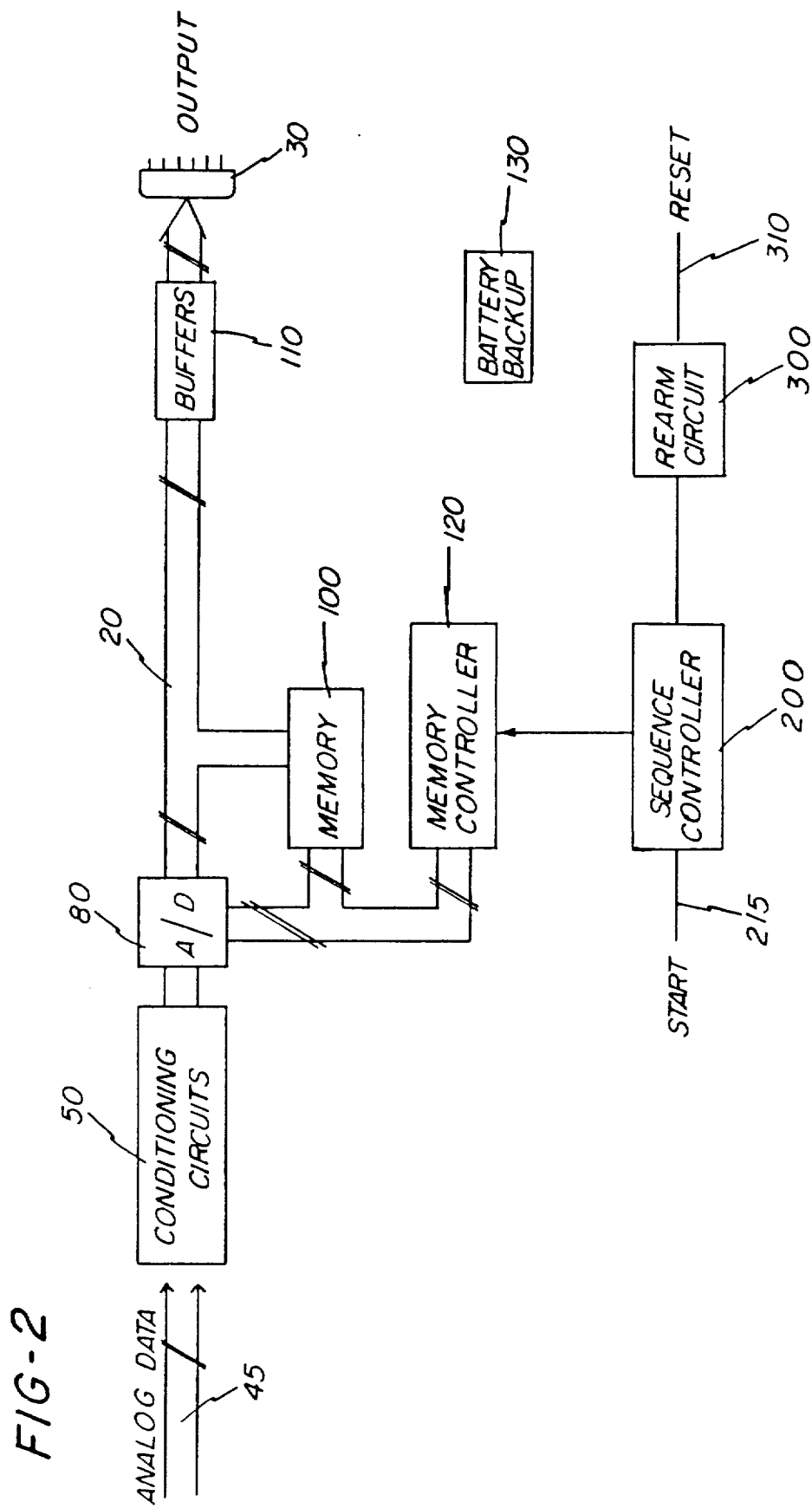
FIG. 2 is an electrical block diagram showing the major components of the invention.

The electronic components of the invention are illustrated in the block diagrams of FIGS. 2-5 in which FIG. 2 is a generalized block diagram of the invention.

Figure 3:
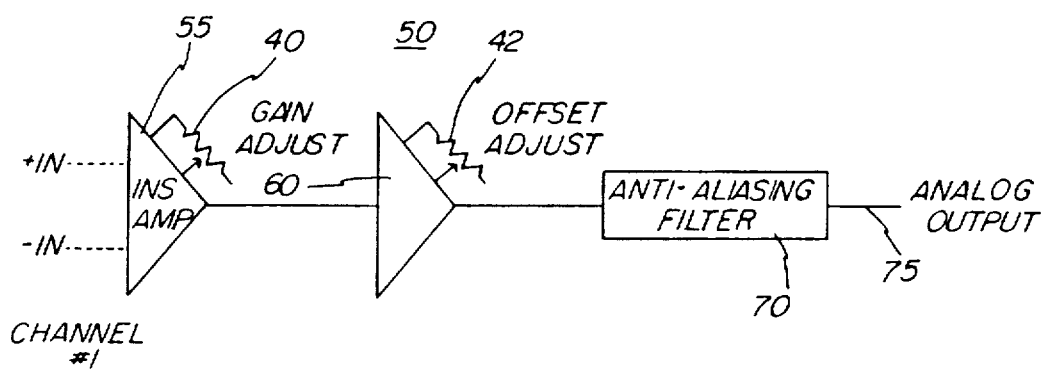
FIG. 3 is an electrical block diagram showing one of the input circuits, including an amplifier and an anti-aliasing filter.

In the present invention, sixteen analog data lines 45 from an activity to be monitored may be applied to a set of eight conditioning circuits 50 (one of which is shown in FIG. 3).

Means are provided for conditioning the input signals prior to processing by the data recorder. One of the conditioning circuits, shown in FIG. 3, includes a first amplifier 55 having a gain adjust potentiometer 40, a second amplifier 60 having an offset adjustment potentiometer 42, and an anti-aliasing filter circuit 70. The output of each of the eight circuits comprising the conditioning circuit 50 provides an analog signal on bus 75 whose voltage output has been modified to bring it within the limits of analog-to-digital converter circuit 80 (FIG. 2).

The analog-to-digital (A/D) converter 80 converts each analog signal on bus 75 to an eight bit digital signal which appears on data bus 90. These digital signals are applied both to a memory device 100 and to a buffer circuit 110. The output of the buffer 110, from either the A/D converter 80 or the memory 100 is available on the multiple pin connector 30 accessible from outside the recorder's housing 10.

The memory device 100 may be a standard 8 bit, 1 megabyte memory, including two 512 KBit by 8 bit CMOS static random access memory modules, such as model number DPS 96122 memories manufactured by Dense-Pac Microsystems, Inc. The memory device 100 is controlled by the memory controller circuit 120 (shown in greater detail in FIG. 4). In the present invention, the memory 100 is configured to record eight bit data signals in eight separate channels and to permit access to that data on the output connector 30 without destroying the data itself. A battery backup system 130 is provided to insure that the data in the memory 100 is retained, even when the data recorder is not connected to an external source of power.

Figure 4:
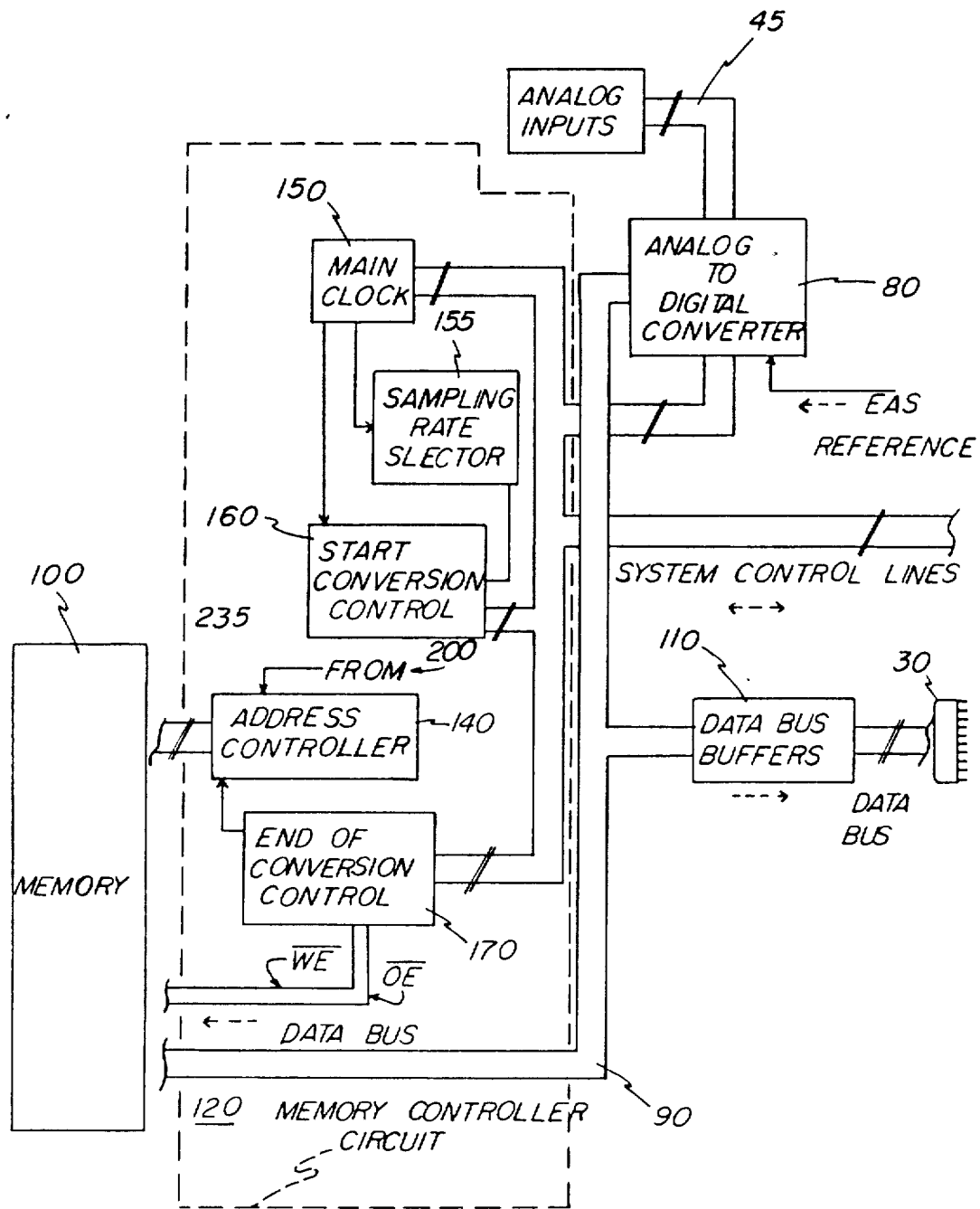
FIG. 4 is an electrical block diagram of the memory controller board.

A memory controller circuit 120 provides the means for controlling the flow of data into the memory means 100 whereby new data is sent to said memory means and old data is discarded or overwritten. As shown in FIG. 4, this circuit includes an address controller 140 which actually determines the memory location where the incoming data is to be recorded. As new data is read into the memory 100, the old data at that memory location is overwritten. When the highest memory address is reached, the address controller will direct the next byte of data to the first or lowest memory address. Thus, the memory 100 is made to act like a recirculating memory device.

The memory controller circuit 120 also includes several circuits that control the operation of other systems. The main clock 150 provides the timing pulses necessary to the transfer of data into and out of the memory 100. The output of the clock may be divided by the sample rate selector 155 into one of four sample rates, selected by the user.

In the preferred embodiment, four data acquisition rates are switch selectable by the sample rate selector 155, namely, 10,000, 5,000, 2,500, and 1,250 samples per second per channel. Of course, the data acquisition rate will also affect the amount of time data can be recorded before the old or first entered data is overwritten. At 10,000 samples per second per channel, data may be recorded for a total of only 13.10 seconds while at 1,250 samples per second per channel, data may be recorded for 104.80 seconds.

A start-conversion control circuit 160 and an end-conversion control circuit 170 serve to synchronize the operation of the analog-to-digital converter 80 and the memory 100. The analog input data on line 45 must be converted to digital form before that data is applied to and recorded in the memory 100 and these circuits insure that the conversion sequence has been completed before the memory records the digital data.

Data will be continuously written into the memory 100 until a start signal is generated in response to a triggering event. As a result, only a predetermined amount of data (depending on the sampling rate) is actually retained since the older data is constantly being overwritten. Accordingly, circuit means in the form of a sequence controller 200 (FIG. 2) is provided. The controller 200 is responsive to the occurrence of the triggering event and provides a signal to the control circuit means or memory controller circuit 120 to terminate the input of new data into the memory means a predetermined time after the triggering event.

The sequence controller 200 is shown in FIG. 5. Included therein is a start conditioner and latch circuit 210 which responds whenever a start signal on input line 215 has been generated to initiate the operation of a trigger timer 220. Timer 220 is also controlled by the main clock 150, and when an output from this timer is generated, all further writing of data into the memory 100 is terminated and the data that is in the memory is protected.

The start signal is user generated. It might be a special signal uniquely generated by the user, or it might be derived from one of the analog input signals 45. For example, one of the input signals might represent acceleration, and the triggering event might be defined as whenever the acceleration exceeds some predetermined value. The user may or may not elect to use one of the eight input channels to record the start signal.

The trigger timer 220 is basically a counter that may be set to count for ½, ¼, or ⅛ of the amount of data in the memory 100. This circuit therefore controls the proportion of data recorded before and after the triggering event. The amount of time data is recorded after the triggering event is selectable, according to the data sampling rate. For example, for a data acquisition rate of 10,000 samples per second per channel, setting the timer for ½ will cause 6.55 seconds of data before and after the event to be recorded. Setting the timer for ¼ will cause 9.8 seconds of data before the event and 3.3 seconds of data after the event to be recorded. Setting the timer for ⅛ will cause 11.5 seconds of data before and 1.6 seconds of data after the event to be recorded. For the other sampling rates, the proportions will remain the same, but the times will vary.

Once the trigger timer 220 has generated an output, no more data may be written into the memory 100. An output from the timer 220 is applied to the read/write controller 230 to inhibit further writing of data. The output of circuit 230 on line 235 controls the address controller 140 shown in FIG. 4.

External power may be provided to the circuit shown in FIG. 5 from either the "XPower" line 205 or on internal NiCad battery 130. If external power is being used, regulator charger 250 will control the charging rate for the battery 130 to maintain it at maximum standby capacity. If the external power on line 205 is removed, then power to the system will be provided by the battery through the regulator 250.

To read the data stored in the memory 100, a signal on the start input 215 is sent to the read counter 280. This device causes the read/write controller 230 to interrogate the memory 100, and the data therein is written to the data bus 90 (FIGS. 2 and 4) and through the data bus buffer 110 to the output connector 30. The recorded data may be read as many times as desired without affecting the memory since the reading operation is non-destructive.

The read counter 280 outputs exactly the same number of pulses as there are addresses in the memory 100. In this way, each time the read counter 280 is activated, the address counter 140 will read all the data in the memory, starting at its present location, reading to the highest memory address, and then reading from the lowest memory address back to the present memory address. The address where data recording was terminated will be determined by the occurrence of the start signal and the setting of the trigger timer 220.

A rearm circuit 300 (FIG. 2X) is employed to reset the start conditioner and latch circuit 210 (FIG. 5) and permit data once again to be recorded in the memory. Since it is important that the data in the memory be protected against inadvertent loss, the rearm circuit requires an unique input signal 310 before it outputs a reset instruction. For example, the rearm circuit might require an a.c. signal of a certain frequency for a predetermined duration before recognizing that signal as a valid rearm instruction.

Reference is now made to FIGS. 6–8 which illustrate the variable data in the memory 100 from one event channel at different times, the bracket 400 represents the data that can be recorded in the memory 100. As stated previously, the amount of time during which data can be recorded is a function of the sampling rate and the size of the memory. As shown in FIG. 6, a signal on event channel 1 is shown as the wave form 410. The old data in the memory is shown at the left while the new data entering the memory is shown at the right in a form similar to that presented by the conventional strip recorders. For purposes of illustration, the information on event channel 2 is shown by the wave form 420 and represents the output of a threshold circuit where the threshold level is shown at 430. Whenever the magnitude of the signal represented by wave form 410 exceeds the threshold level, there will be an output in channel 2, as represented at 440.

If the output 440 is regarded as a triggering event, then this information may be used to control how much data is recorded both before and after the triggering event in the memory 100. In FIG. 7, it is seen that additional data has entered into the memory, that is, written over the old data which is now lost. In FIG. 7, the data recorded after the triggering event occupies about one-fourth of the memory.

In FIG. 8, one-half of the old data (that was present in the memory at the time of FIG. 6) has now been overwritten. If the trigger timer 220 (FIG. 5) is set at 50-50%, then no new data will be thereafter accepted, and the data stored in the memory as shown in FIG. 8 will remain until the appropriate rearming signal on line 310 has been received.

It is noted that in both FIGS. 7 and 8, additional pulses 445 are shown since the input signal has exceeded the threshold level 430; however, these additional pulses will not affect the operation of the circuit since it is only the initial triggering event that initiates the memory protection scheme.

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. A portable multiple channel data recorder for use in storing in a non-volatile memory a limited quantity of data occurring before and after a triggering event, said recorder comprising:
    digital memory means comprising a plurality of separate channels for storing simultaneously a fixed amount of data in each channel;
    means for retaining the data stored in said memory means;
    control circuit means for controlling the flow of data into said memory means;
    means responsive to the occurrence of the triggering event for providing a signal to said control circuit means to terminate the input of new data into said memory means a predetermined time thereafter; and
    means responsive to a unique signal for thereafter permitting the recording of new data into said memory means.

2. The data recorder of claim 1 wherein the predetermined time after the triggering event is selectable.

3. The data recorder of claim 1 further including a signal conditioning means for converting analog data into digital form for recording in said digital memory system.

4. The data recorder of claim 1 further including threshold circuitry for sensing the occurrence of a triggering event by sensing a change in the signal level of one of the data inputs by a predetermined amount.

5. The data recorder of claim 1 wherein said data retaining means is a battery.

6. A light weight violent event data recorder having a limited storage capacity for use in storing quantity of data occurring before and after a triggering event, said recorder comprising
    a multiple channel, digital memory means of limited capacity for storing a fixed amount of data;
    control circuit means for controlling the flow of data into said memory means whereby new data is sent to said memory means and old data is discarded;
    means responsive to the occurrence of the triggering event for providing a signal to said control circuit means to terminate the input of new data into said memory means a predetermined time after the triggering event; and
    means responsive to a unique signal for resetting the control circuit means to permit recording of new data.

7. The data recorder of claim 6 further including means for retrieving the stored data.

* * * * *